(12) United States Patent
Li

(10) Patent No.: US 10,564,764 B2
(45) Date of Patent: Feb. 18, 2020

(54) LUMINOUS PRESSURE SENSOR AND TOUCH CONTROL BUTTON THEREOF, AND ELECTRONIC DEVICE

(71) Applicant: SHENZHEN NEW DEGREE TECHNOLOGY CO., LTD., Shenzhen (CN)

(72) Inventor: Hao Li, Shenzhen (CN)

(73) Assignee: SHENZHEN NEW DEGREE TECHNOLOGY CO., LTD., Shenzhen (CN)

( * ) Notice: Subject to any disclaimer, the term of this patent is extended or adjusted under 35 U.S.C. 154(b) by 234 days.

(21) Appl. No.: 15/518,587

(22) PCT Filed: Apr. 30, 2015

(86) PCT No.: PCT/CN2015/077956
§ 371 (c)(1),
(2) Date: Apr. 12, 2017

(87) PCT Pub. No.: WO2016/172917
PCT Pub. Date: Nov. 3, 2016

(65) Prior Publication Data
US 2017/0242535 A1 Aug. 24, 2017

(51) Int. Cl.
*G01L 1/26* (2006.01)
*G06F 3/041* (2006.01)
*H03K 17/96* (2006.01)

(52) U.S. Cl.
CPC .............. *G06F 3/0416* (2013.01); *G01L 1/26* (2013.01); *H03K 17/96* (2013.01); *G06F 2203/04105* (2013.01); *H03K 2217/96042* (2013.01)

(58) Field of Classification Search
CPC .......... G06F 3/0416; G01L 1/26; H03K 17/96
(Continued)

(56) References Cited

U.S. PATENT DOCUMENTS

2005/0241927 A1* 11/2005 Kim .................. H01H 13/7006
200/310
2008/0094373 A1 4/2008 Song
(Continued)

FOREIGN PATENT DOCUMENTS

| CN | 1694200 | 11/2005 |
| CN | 200990313 | 12/2007 |

(Continued)

OTHER PUBLICATIONS

International Search Report for PCT/CN2015/077956 dated Feb. 14, 2016, 6 pages.

*Primary Examiner* — Edwin A. Leon
*Assistant Examiner* — Iman Malakooti
(74) *Attorney, Agent, or Firm* — Nixon & Vanderhye PC

(57) ABSTRACT

A luminous pressure sensor comprises a feedback assembly capable of emitting light when pressure is applied thereto, and a pressure sensing layer. A sensing plate is provided between the feedback assembly and the pressure sensing layer, and is connected to the feedback assembly and the pressure sensing layer via a connecting adhesive layer. The sensing plate is provided with at least one pressing structure thereon for concentrating pressing force. A touch control button may comprise the luminous pressure sensor, and an electronic device may comprise the touch control button. The luminous pressure sensor has a simple structure and a low manufacturing cost, and is easy to assemble and to commercialize.

23 Claims, 4 Drawing Sheets

(58) Field of Classification Search
USPC .......................................... 200/5 A, 314, 516
See application file for complete search history.

(56) References Cited

U.S. PATENT DOCUMENTS

| | | | | |
|---|---|---|---|---|
| 2009/0194404 A1* | 8/2009 | Kubo | .................... | G06F 3/0414 |
| | | | | 200/5 D |
| 2015/0083561 A1* | 3/2015 | Han | ..................... | H01H 13/83 |
| | | | | 200/314 |
| 2015/0090571 A1* | 4/2015 | Leong | .................... | H01H 13/83 |
| | | | | 200/5 A |
| 2015/0348726 A1* | 12/2015 | Hendren | ................. | H01H 13/85 |
| | | | | 200/513 |

FOREIGN PATENT DOCUMENTS

| | | | | |
|---|---|---|---|---|
| CN | 101364493 | | 2/2009 | |
| CN | 201303471 | | 9/2009 | |
| CN | 102334328 | | 1/2012 | |
| CN | 102914272 | * | 2/2013 | ............... G01B 1/00 |
| CN | 202808676 | * | 3/2013 | ............ C09J 133/00 |
| CN | 103354186 | | 10/2013 | |
| TW | 201101357 | | 1/2011 | |
| WO | WO 97/16834 | | 5/1997 | |

* cited by examiner

LUMINOUS PRESSURE SENSOR AND TOUCH CONTROL BUTTON THEREOF, AND
ELECTRONIC DEVICE

This application is the U.S. national phase of International Application No. PCT/CN2015/077956 filed Apr. 30, 2015 which designated the U.S., the entire content of which is hereby incorporated by reference.

TECHNICAL FIELD

The present application relates to the technical field of sensor structures, and more particularly, relates to a luminous pressure sensor, a touch control button, and an electronic device equipped therewith.

BACKGROUND

At present, pressure sensors are being gradually applied in various fields. Main functions of the pressure sensors are to increase the amount of information, and provide the possibility to detect the level of pressure. By means of pressure operations, switch actions, information encryption and the like can be performed effectively. By adding a luminous system, a visual feedback can be provided timely, an operation interface can be visually pleasing, and user experience can be improved.

In the present industry, there have already been some pressure sensors, such as capacitive sensors or piezoelectric ceramic sensors. All the pressure sensors themselves are formed by complex circuit designs and structure designs. For example, a capacitive sensor needs to strictly control a distance between each capacitive point and a front panel, and obtains pressure information through the change of said distance. This method requires very high processing precision and assembly precision. A piezoelectric ceramic sensor measures the magnitude of pressure by exerting a transient impact on a piezoelectric ceramic and obtaining a transient voltage change. In manufacturing, the piezoelectric ceramic sensor requires unified and consistent piezoelectric ceramic components, and needs to be mounted in a designated structure using a special assembly method. These pressure sensors require being realized by special methods, which greatly improves the using cost of the pressure sensors and hinders large-scale adoption of luminous pressure sensors.

Technical Problem

The purpose of the present application is to overcome the defects in the prior art and to provide a luminous pressure sensor, which has a simple structure, is easy to assemble, has a low manufacturing cost, and is easy to commercialize. Moreover, it can be used reliably and is visually pleasing, improves aesthetic property of touch control buttons and electronic devices, and enriches users' experience at the same time.

BRIEF SUMMARY

A technical solution of the application is as follows: a luminous pressure sensor, comprising a feedback assembly capable of emitting light when pressure is applied thereto, and a pressure sensing layer for detecting pressure; a sensing plate is provided between the feedback assembly and the pressure sensing layer, the sensing plate is connected to the feedback assembly via a first connecting adhesive layer, the sensing plate is connected to the pressure sensing layer via a second connecting adhesive layer, and the sensing plate is provided thereon with at least one pressing structure for concentrating pressing forces.

Furthermore, the luminous pressure sensor further comprises a processing circuit layer configured for receiving and processing pressure signals, the processing circuit layer is electrically connected with the feedback assembly and the pressure sensing layer by a connecting wire.

Specifically; the pressure sensing layer is a coating or circuit with a pressure sensing function, the center thereof is provided, with at least one sensor configured for pressure sensing, the sensing plate overlaps with the pressure sensing layer, and the sensor is located, at a center place of the pressing structure where stress is concentrated.

Specifically, the pressing structure comprises a pressure concentrating point and at least two first extending vacant areas extending outwards from the pressure concentrating point.

Specifically, the first extending vacant area is shaped as a strip structure.

Specifically, the at least two first extending vacant areas are arranged symmetrically or asymmetrically.

Specifically, a second extending vacant area extending sideways is provided at a distal end of each of the first extending vacant space.

Specifically, the at least two second extending vacant areas are arranged symmetrically or asymmetrically.

Specifically, the second extending vacant area is shaped as a strip structure.

Specifically, the second extending vacant area is shaped as an arc structure.

Specifically, the feedback assembly comprises a luminous body and a light-guiding element, and the luminous body is located, at two sides or a lower end of the light-guiding element.

Furthermore, a light insulator configured for avoiding optical crosstalk is provided between the two adjacent light-guiding elements.

Preferably, the luminous body is a LED light.

Specifically; the feedback assembly comprises a plurality of luminous bodies, each of the luminous bodies is an EL panel.

Specifically, a light insulator configured for avoiding optical crosstalk is provided between every two adjacent luminous bodies.

Specifically; the first connecting adhesive layer is made of VHB acrylic plastic foam, AB glue, double-sided adhesive or silica gel, and the thickness of the first connecting adhesive layer ranges from 0.1 mm to 1.0 mm.

Preferably, the first connecting adhesive layer is made of VHB acrylic plastic foam, and the thickness thereof is 0.4 mm.

Specifically, the second connecting adhesive layer is made of AB glue, VHB acrylic plastic foam, double-sided adhesive or silica gel, and the thickness of the second connecting adhesive layer ranges from 0.02 mm to 0.2 mm.

Preferably, the second connecting adhesive layer is made of AB glue, and the thickness thereof is 0.025 mm.

The present application further provides a touch control button, comprising an elastically deformable touch control panel, and further comprising the above-mentioned luminous pressure sensor, the touch control panel is connected with the feedback assembly via a third connecting adhesive layer, and a light hole configured for allowing light to pass through is provided at a center of the touch control panel located on the pressing structure.

Specifically, the third connecting adhesive layer is made of transparent VHB acrylic plastic foam, transparent double-sided adhesive, transparent AB glue, transparent silica gel, OCA optical adhesive, and the thickness of the third connecting adhesive layer ranges from 0.1-1.0 mm.

Preferably, the third connecting adhesive layer is made of transparent VHB acrylic plastic foam, and the thickness thereof is 0.2 mm.

The present application further provides an electronic device, which comprises the above-mentioned touch control button.

Beneficial Effects

The luminous pressure sensor provided by the present application, by the arrangement of the feedback assembly and a pressing structure, not only can ensure the pressing sensitivity but also emits light when in use; actual working conditions can be timely acquired, overall aesthetic property can be further improved, and thus users' experience can be improved. Meanwhile, the feedback assembly is integrated with the sensing plate by the first connecting adhesive layer, and the pressure sensing layer is integrated with the sensing plate by the second connecting adhesive layer, the structure is simple and the assembly is convenient; a reliable and steady pressure sensor can be obtained without complex structural processing and assembling processes, manufacture difficulty and cost are lowered, the pressure sensor can be promoted to use at a large scale, and the function range of the product is expanded.

The touch control button and electronic device produced using the above-mentioned luminous pressure sensor have a higher control precision and a better operational reliability, and can emit light in use, such that users' enthusiasm of using the luminous pressure sensing technique can be improved, the difficulty of the users' application can be lowered, and users' or customers' experience during the pressing operation can be enriched.

DETAILED DESCRIPTION OF THE PREFERRED EMBODIMENT

In order to make the purpose, the technical features and the advantages of the present application be clearer, the present application will be described in detail with reference to accompanying drawings and embodiments. It should be understood that the specific embodiments described herein are used for interpretation of present application merely, rather than the limitation to the present application. For the sake of brevity, many traditional techniques and principles relating to a pressure sensor need not and will not to be described in detail. The term "example" means a paradigm, an instance or an illustration, but not a model or a reasonable imitation.

The realization of the present invention will be described hereafter with reference to the accompany drawings.

Figure 1:
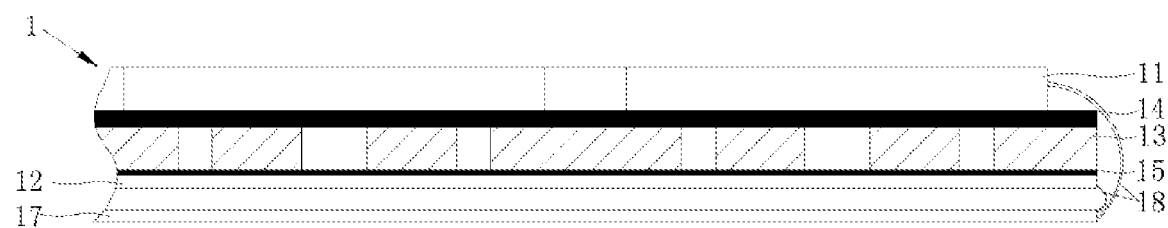
FIG. 1 is a schematic structural view of a luminous pressure sensor provided by an embodiment of the application.

As shown in FIG. 1, a pressure sensor 1 provided by an embodiment of the application comprises a luminous feedback assembly 11 and a pressure sensing layer 12 for detecting pressure. When the pressure sensing layer 12 is subjected to a pressure, the resistance, capacitance, voltage or other parameters thereof will be changed to generate a corresponding pressure signal, the feedback assembly 11 will be illuminated upon receiving the pressure signal. The actual working condition of the sensor 1 can be obtained by identifying whether the feedback assembly 11 is illuminated or not, and the emitting light can provide a visual feedback to beautify the operation interface and improve the user experience.

During the actual operation, the feedback assembly 11 can be directly pressed, the pressure can be transferred by the feedback assembly 11 and finally transferred to the pressure sensing layer 12 via a sensing plate. At this time, the feedback assembly 11 should have certain elastic deformation capability. Of course, it should be understood that the pressure can be sensed by providing a panel structure on the feedback assembly 11 to perform a pressing operation or by other methods.

Figure 3:
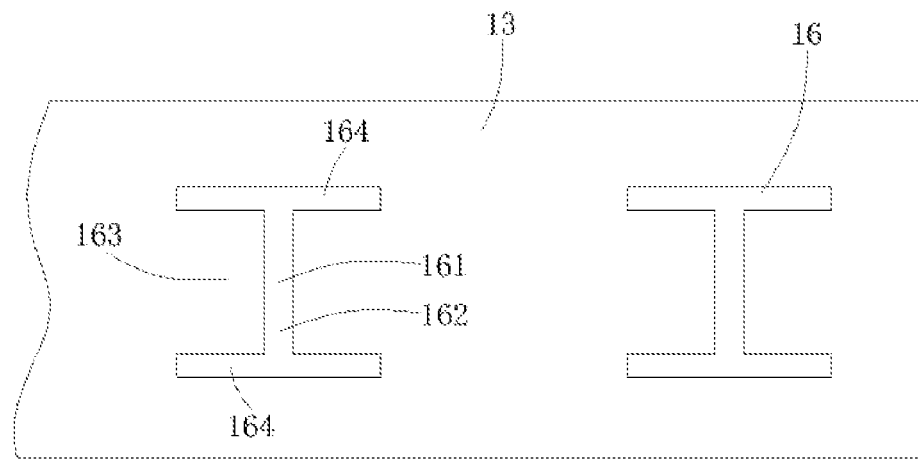
FIG. 3 is a schematic view of a pressing structure of the luminous pressure sensor provided by the embodiment of the application.
Figure 4:
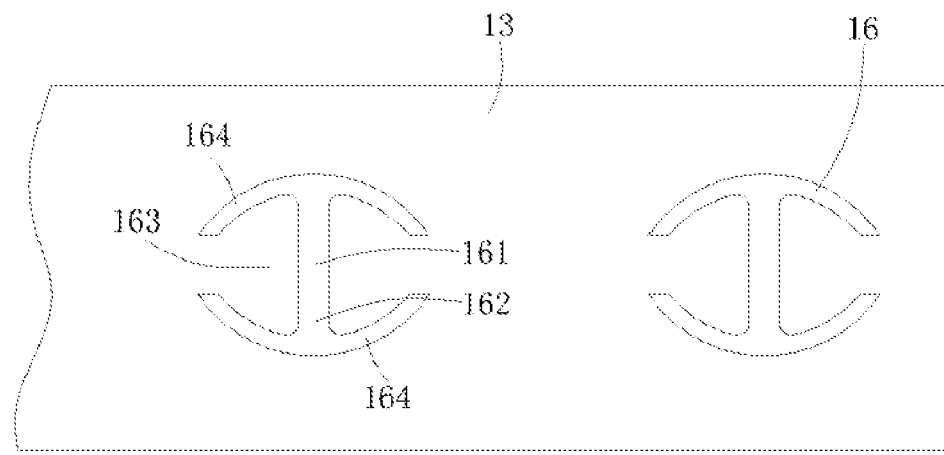
FIG. 4 is another schematic structural view of the pressing structure of the luminous pressure sensor provided by the embodiment of the application.

Specifically, as shown in FIG. 1, FIG. 3 and FIG. 4, in the embodiment, a sensing plate 13 is provided between the feedback assembly 11 and the pressure sensing layer 12 for concentrating stresses, the sensing plate 13 is connected with the feedback assembly 11 by a first connecting adhesive 14, and the sensing plate 13 is connected with the pressure sensing layer 12 by a second connecting adhesive 15. For ensuring pressing sensitivity, the sensing plate 13 is provided thereon with at least one pressing structure (not labeled in the drawings) for concentrating pressing forces. The pressing structure can concentrate an applied force to one point, such that the applied force can be transferred to the pressure sensing layer 12 after being concentrated by the pressing structure, which can improve the response sensitivity of the sensor.

As shown in FIG. 1, in the embodiment, a first connecting adhesive layer 14 is located between the sensing plate 13 and the feedback assembly 11 for providing adhesion and fixing functions. The first connecting adhesive layer 14 can be made of double-sided adhesive, VHB acrylic plastic foam (VHB is the abbreviation of "Very High Bond", the Chinese literal translation thereof is "a very strong adhesive connection"), AB glue (two-component adhesive), silica gel or other equivalents. In the specific application, the type and thickness of the material adopted by the first connecting adhesive 14 can be determined according to actual production conditions, the thickness thereof ranges from 0.1 to 1.0 mm. In one embodiment, the first connecting adhesive layer 14 used by the adhesion between the sensing plate 13 and the feedback assembly 11 is made of VHB acrylic plastic foam with the thickness of 0.4 mm.

As shown in FIG. 1, in the embodiment, a second connecting adhesive layer 15 is located between the sensing plate 13 and the pressure sensing layer 12 for providing adhesion and fixing functions. Requirements for the second connecting adhesive layer 15 are different from those for the first connecting adhesive layer 14. For ensuring that the applied pressure can be precisely and timely transferred to the pressure sensing layer 12, the second connecting adhesive layer 15 should have characteristics of high hardness and low creep after solidification, such that the pressure obtained by the sensing plate 13 can be precisely transferred to the pressure sensing layer 12. The second connecting adhesive layer 15 can be made of AB glue, VHB acrylic plastic foam, double-sided adhesive, silica gel or other equivalents conforming to operation requirements, the thickness thereof ranges from 0.02 to 0.2 mm. In one embodiment, the second connecting adhesive layer 15 is made of AB glue with the thickness of 0.025 mm.

Furthermore, as shown in FIG. 1, in the producing process, a processing circuit capable of receiving and processing pressure signals can be integrated with the pressure sensing layer 12, such that the processing circuit can drive the feedback assembly 11 to illuminate. However, in the embodiment, as shown in FIG. 1, for improving the convenience of production, the processing circuit is provided independently. Therefore, the luminous pressure sensor 1 further comprises a processing circuit layer 17 configured for receiving and processing pressure signals, the processing circuit layer 17 is electrically connected with the feedback assembly 11 and the pressure sensing layer 12 by a connecting wire 18. The connecting wire 18 is merely used to introduce a connecting method between the pressure sensing layer 12 and the feedback assembly 11, which is a direct or indirect, but not mechanical connection. Moreover, the connection can be established by other methods, such as by a wireless method.

The processing circuit layer 17 is commonly described as a combination of hardware and software having various processing methods. The hardware and software are configured to feedback results input by the pressure sensing layer 12 or communicate the results with a system provided by a customer to perform additional related tasks or functions. In one embodiment, the processing circuit layer 17 can be realized as a general processor, a content addressable memory, a digital signal processor, a D/A switch, a programmable logic device, an independent hardware assembly or other combinations, and further comprises algorithms and software information associated with a pressure touch screen/pressure sensing system. The hardware and software in the processing circuit layer 17 can be configured to have the function of performing various functions, techniques, feedbacks and tasks processing functions associated with a customer system.

Specifically, in the embodiment, the pressure sensing layer 12 formed by printing or other methods can be designed as a coating or circuit which is thin and has a pressure sensing function, and the pressure sensing layer 12 is provided therein with at least one sensor for sensing pressure (not shown in drawings). Furthermore, for realizing the pressure sensing function precisely and sensitively, in production, the sensor should be ensured to be located at the stress concentration center on the pressing structure during the process of overlapping the sensing plate 13 and the pressure sensing layer 12, that is, the sensor should be in one-to-one correspondence to the pressing structure.

In one exemplary embodiment, the pressure sensing layer 12 is a printed polymer coating with a pressure sensing function. In another embodiment, the pressure sensing layer 12 is a sintered piezoelectric ceramic coating. Although the pressure sensing layer 12 is a coating or circuit in the embodiments, the application is not limited to that. The pressure sensing layer 12 can also be an independent pressure sensing sensor or any detecting device that can sense pressure.

Furthermore, the pressure sensing layer 12 can adopt other techniques, such as a quantum tunnel combination, a capacitive sensor or other pressure sensitive resistor techniques.

Specifically, as shown in FIG. 2 to FIG. 8, because the sensing plate 13 is overlaid on the pressure sensing layer 12 via the second connecting adhesive layer 15, for improving the pressure sensing sensitivity, the sensing plate 13 is provided with at least one pressing structure 16 for concentrating pressing forces, therefore, the pressure on the sensing plate 13 can be concentrated to the center of the pressing structure 16, and the center of each pressing structure 16 is provided with a sensor, such that the sensing sensitivity and precision can be ensured. The pressing structure 16 can be substantially a cut-out pattern formed according to design requirements. Furthermore, the sensing plate 13 can be provided with a plurality of pressing structures 16 according to different operation requirements.

As shown in FIG. 2 to FIG. 8, the sensing plate 13 can be provided with a plurality of pressing structures 16. The pressing structures are distributed on the sensing plate 13, and for better facilitating the concentration of outer pressures, the pressing structure 16 of the embodiment comprises a pressure concentrating point 161 and at least two first extending vacant areas 162 extending outwards from the pressure concentrating point 161. In this arrangement, a solid part of the sensing plate 13 is located between adjacent first extending vacant areas 162. In other words, the first extending vacant areas 162 converge at the pressure concentrating point 161, and the solid part between adjacent first extending vacant areas 162 forms a cantilever structure 163; in this way, when a pressure or other force is applied to the pressing structure 16 of the sensing plate 13, the cantilever structure 163 will generate a deformation (the deformation reaches the maximum at the central point of the pressing structure 16) and the pressure can be concentrated to the pressure concentrating point 161 of the pressing structure 16. Furthermore, the central point of the pressing structure 16 is the pressure concentrating point 161, therefore the sensor is located at the central point of the pressing structure 16, such that the effect of the pressure can be precisely sensed and the sensing sensibility can be improved.

Specifically, as shown in FIG. 3 and FIG. 4, for benefiting the production, the first extending vacant area 162 is shaped as a transversal strip structure, of course, it can also be configured to be other shapes and structures, such as an arc shape. Therefore, the protection for the shape and structure of the first extending vacant area 162 of the embodiment is not limited thereto. In the embodiment, for simplifying the structure and being convenient to manufacturing, there are two first extending vacant areas 162, and the two first extending vacant areas 162 can be arranged symmetrically or asymmetrically; in the embodiment, the two first extending vacant areas 162 are arranged symmetrically, that is, one first extending vacant area 162 can be placed by rotating the other first extending vacant area 162 by 180 degrees about the center of the pressure concentrating point 161, thereby further facilitating a uniform concentration of the pressure or applied force to the pressure concentrating point 161.

Again, as shown in FIG. 3, a second extending vacant area 164 configured to extend sideways thereof is provided at a distal end of each first extending vacant area 162, such that the pressure can be further concentrated to the pressure concentrating point 161; furthermore, the two second extending vacant areas 164 can be arranged symmetrically or asymmetrically, specifically, in the embodiment, the second extending vacant areas 164 are arranged symmetrically, that is, one second extending vacant area 164 can be placed by rotating the other second extending vacant area 164 by 180 degree about the center of the pressure concentrating point 161, thereby further facilitating a uniform concentration of the pressure or applied force at the pressure concentrating point 161. Preferably, for benefiting the production, the second extending vacant area 164 is shaped as a transversal strip structure, and the four formed second extending vacant areas 164 are not connected with each other.

Furthermore, as shown in FIG. 4, in another embodiment, there are two first extending vacant areas 162, and there are also two corresponding second extending vacant areas 164, but the two second extending vacant areas 164 are arc-shaped, and the two arc-shaped second extending vacant areas 164 are not connected with each other, thereby forming a non-closed circle.

Figure 5:
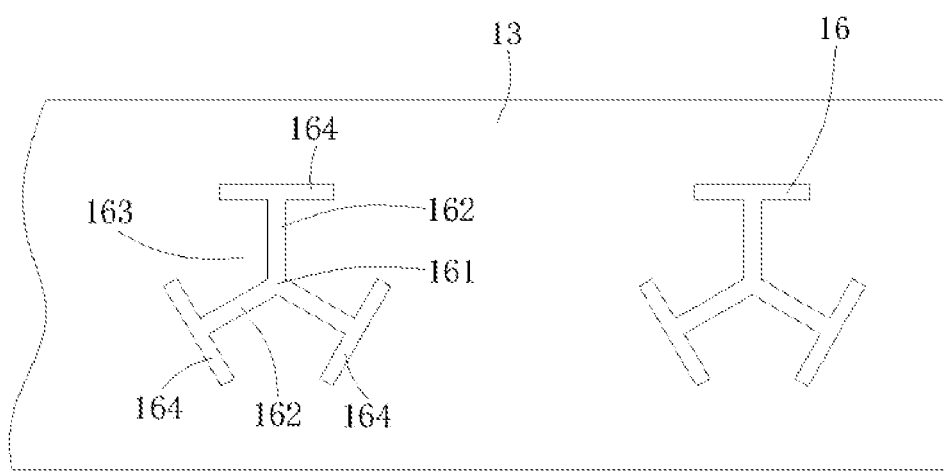
FIG. 5 is another schematic structural view of the pressing structure of the luminous pressure sensor provided by the embodiment of the application.
Figure 6:
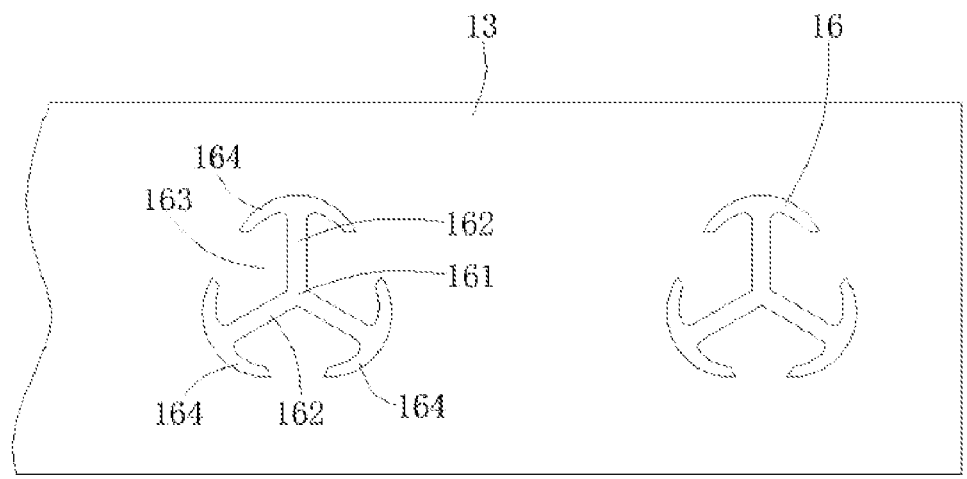
FIG. 6 is another schematic structural view of the pressing structure of the luminous pressure sensor provided by the embodiment of the application.

Furthermore, as shown in FIG. 5 and FIG. 6, in another embodiment, there are three first extending vacant areas 162, wherein the three first extending vacant areas 162 are arranged symmetrically, that is, one first extending vacant area 162 can be placed by rotating another first extending vacant space 162 by 120 degree about the center of the pressure concentrating point 161, thereby further facilitating a uniform concentration of the pressure or applied force to the pressure concentrating point 161. Correspondingly, there are three second extending vacant areas 164, wherein the three second extending vacant areas 164 are arranged symmetrically, that is, one second extending vacant area 164 can be placed by rotating another second extending vacant space 164 by 120 degree about the center of the pressure concentrating point 161, thereby further facilitating a uniform concentration of the pressure or applied force at the pressure concentrating point 161. Furthermore, the three second extending vacant areas 164 are shaped as transversal strip structures, of course, it can be understood that the three second extending vacant areas 164 can also be shaped as arc structures.

Figure 7:
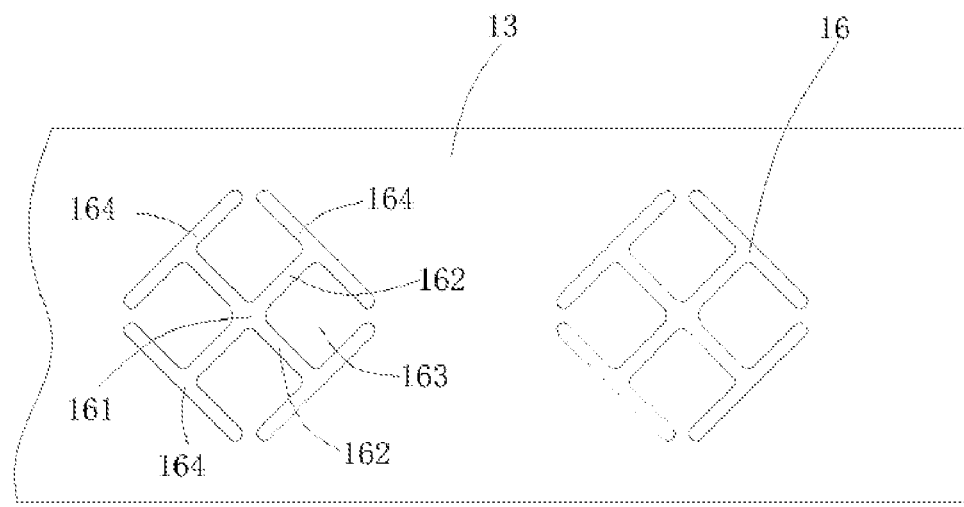
FIG. 7 is another schematic structural view of the pressing structure of the luminous pressure sensor provided by the embodiment of the application.
Figure 8:
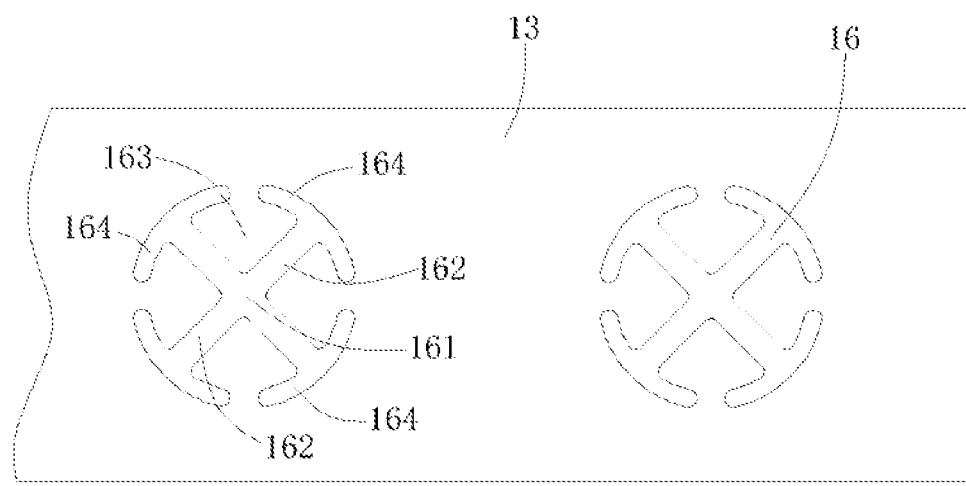
FIG. 8 is another schematic structural view of the pressing structure of the luminous pressure sensor provided by the embodiment of the application.

Furthermore, as shown in FIG. 7 and FIG. 8, in another embodiment, there are four first extending vacant areas 162, wherein the four first extending vacant areas 162 are arranged symmetrically, that is, one first extending vacant space 162 can be placed by rotating another first extending vacant space 162 by 90 degrees about the center of the pressure concentrating point 161, thereby further facilitating a uniform concentration of the pressure or applied force at the pressure concentrating point 161. Correspondingly, there are four second extending vacant areas 164, wherein the three second extending vacant areas 164 are arranged symmetrically, that is, one second extending vacant area 164 can be placed by rotating another second extending vacant space 164 by 90 degree about the center of the pressure concentrating point 161, thereby further facilitating a uniform concentration of the pressure or applied force to the pressure concentrating point 161. Furthermore, the four second extending vacant areas 164 are shaped as transversal strip structures, of course, it can be understood that the four second extending vacant areas 164 can also be shaped as arc structures.

Figure 9:
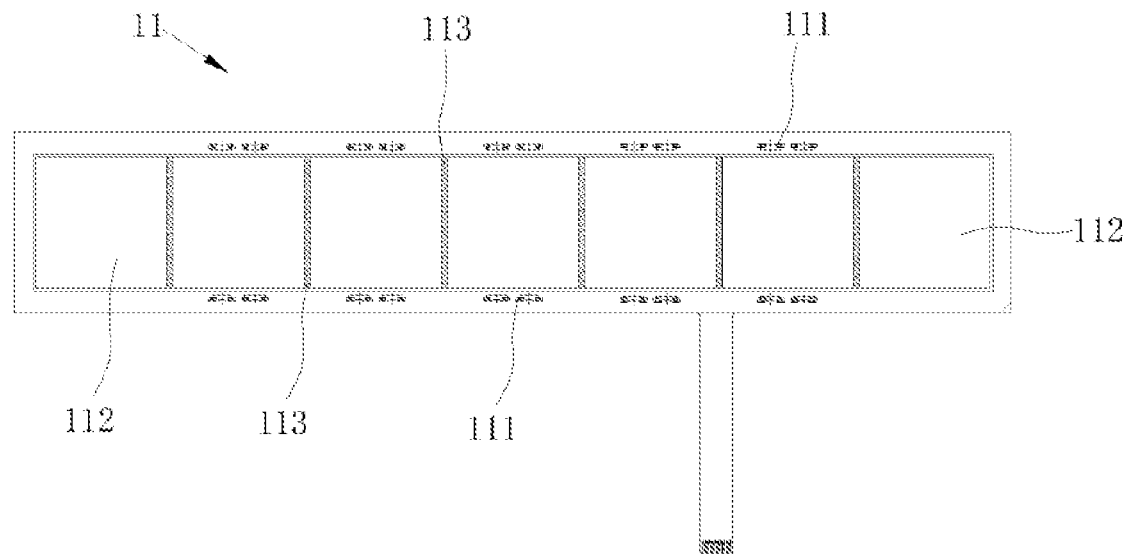
FIG. 9 is a schematic structural view of a feedback assembly of the luminous pressure sensor provided by the embodiment of the application.

Specifically, as shown in FIG. 9, in an embodiment, the feedback assembly 11 comprises a luminous body 111 and a light-guiding element 112, the luminous body 111 is located at two sides or a lower end of the light-guiding element 112. The luminous body 111 can be lighted by receiving signals sent from the processing circuit layer via the connecting wire 18 and emits the light into the light-guiding element 112, the light-guiding element 112 can convert the parallel light into uniformly divergent light, such that the light can be seen by a user. The luminous body 111 is a LED light, the light-guiding element 112 is a white ink printed acrylic. At the same time, in order to avoid optical crosstalk between the light-guiding elements 112, which causes unclearly displaying, a light insulator 113 is provided between adjacent light-guiding elements 112, such that it is ensured that light in each light-guiding element 112 is independent and not crossed, therefore ensuring the displaying definition.

Figure 10:
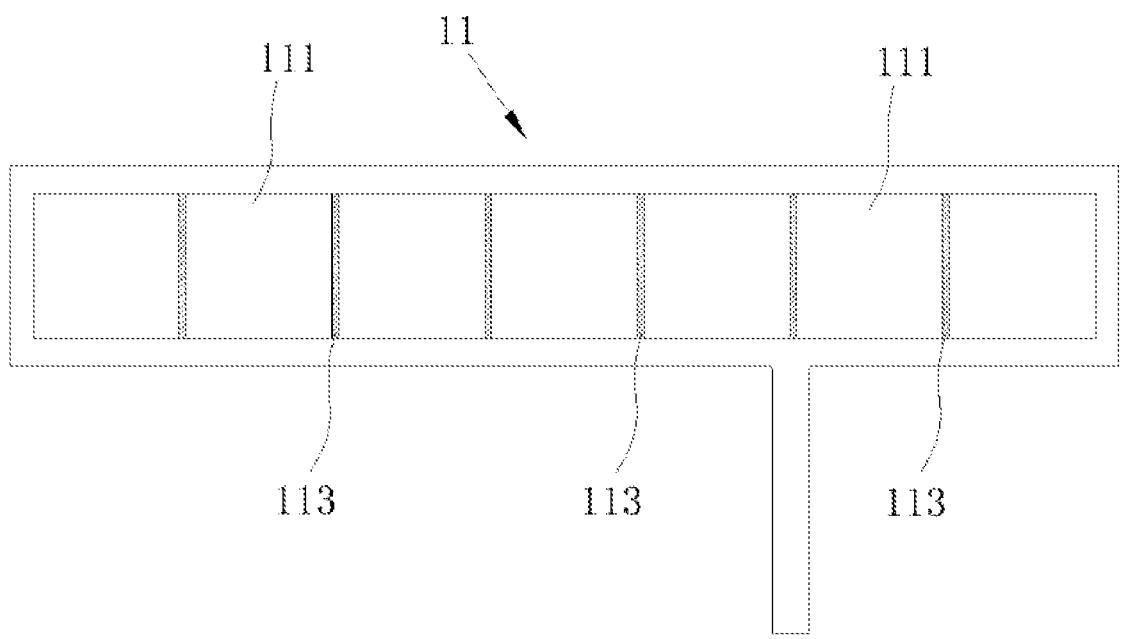
FIG. 10 is another schematic structural view of the feedback assembly of the luminous pressure sensor provided by the embodiment of the application.

Furthermore, as shown in FIG. 10, in another embodiment, the feedback assembly 11 comprises a plurality of luminous bodies 111, the luminous body 111 is an EL panel (EL is the abbreviation of Electro Luminescent, the electroluminescent panel is also referred as an electroluminescence). When the EL panel is used as the luminous body 111 to illuminate, a light-guiding element can be provided for the luminous body 111, and it is also possible that the light-guiding element is not provided. In the embodiment, the luminous body 111 is not provided with any light-guiding element. Furthermore, in order to avoid optical crosstalk between the luminous bodies 111, a light insulator 113 is provided between adjacent luminous bodies 111, such that it is ensured that light in each luminous body 111 is independent and not crossed, therefore ensuring the displaying definition.

Figure 2:
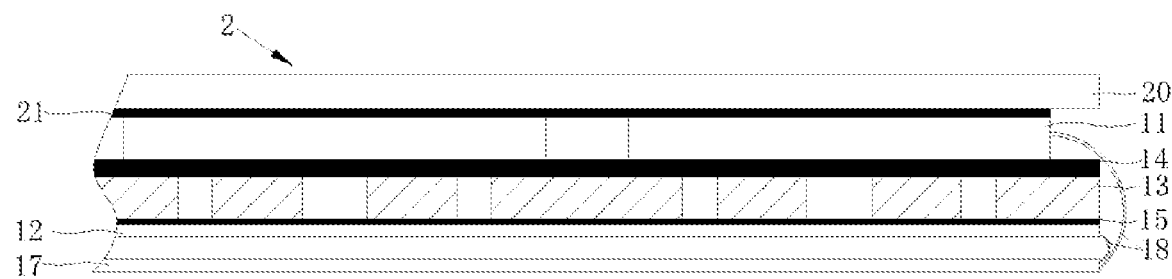
FIG. 2 is a schematic structural view of a touch control button provided by the embodiment of the application.

As shown in FIG. 1 and FIG. 2, the embodiment of the application further provides a touch control button 2, which comprises a touch control panel 20 which is elastically deformable, and further comprises an above-mentioned luminous pressure sensor 1. The touch control panel 20 is connected with the feedback assembly 11 via a third connecting adhesive layer 21, the third connecting adhesive layer 21 is adhered on the feedback assembly 11, so as to be adhered with the touch control panel 20 during the assembly. The third connecting adhesive layer 21 can be made of transparent double-sided adhesive, transparent VHB acrylic plastic foam, transparent AB glue, transparent silica gel, OCA optical adhesive (OCA: the abbreviation of Optically Clear Adhesive) or other equivalents, but should have certain optical transmittance. Material selections and thicknesses of those adhesive materials are dependent upon the material of the touch control panel 20, and the thickness thereof ranges from 0.1 mm to 1.0 mm. In one embodiment, the touch control panel 20 is adhered with the feedback assembly 11, and the adopted third connecting adhesive layer 21 is made of VHB acrylic plastic foam and has the thickness of 0.2 mm. However, for the purpose of light transmitting, a light hole configured for allowing light to transmit is provided at the central position of the touch control panel 20 located on the pressing structure (not shown in drawings), such that the light emitted from the feedback assembly 11 can be clearly displayed from the light hole, and thus functions of pressure identification, pressure sensing, and luminous feedback and reminding desired by users can be obtained, and overall aesthetic property of the touch control panel 20 can also be improved. Of course, it can be understood that it is unnecessary to provide the light hole when overall transparency of the touch control panel 20 is great. However, in order to avoid inner electrical elements from being displayed and influencing the overall aesthetic property, it is necessary to perform a shading treatment at corresponding places of the touch control panel 20.

The touch control panel 20 involved in the embodiment should have a certain elastic deformation capability, it can be operated by a user and maintain structure rigidity by itself, and it has a light hole for the light to pass through. In the sense of having the certain elastic deformation capability, the touch control panel 20 is elastically deformable and can recover its initial state. In the initial state, its own electronic and structural functions can be maintained. For example, in the embodiment, the touch control panel 20 can be deformed and curved along its neutral axis. In another embodiment, the touch control panel 20 can be collapse-deformed at one point. In various embodiments, the touch control panel 20 has enough elastic deformation to correspond to its lower structures.

Specifically, the touch control panel 20 has a rigid structure to maintain itself, the reason is that the formed panel itself should not deform and collapse when no outer force applies. In one embodiment, the touch control panel 20 can be made from stainless steel with a certain thickness, in another embodiment, the touch control panel 20 can be made from glass, plastic and so on, and the thickness of those materials should be enough to maintain the flatness of the structure.

Specifically, as shown in FIG. 2 to FIG. 8, the touch control panel 20 is adhered with the feedback assembly 11 by the third connecting adhesive layer 21, a force is applied at a predetermined button place of the touch control panel 20 having the light hole. The force will be transferred to the sensing plate 13 via the third connecting adhesive layer 21, the feedback assembly 11 and the first connecting adhesive layer 14, the function point is the pressure concentrating point 161 of the pressing structure 16; the pressing structure 16 will be deformed under the effect of the pressure, and the force will be transferred to the pressure sensing layer 12 through the second connecting adhesive layer 15. Under the effect of the pressure, the resistance, capacitance, voltage or other parameters of the pressure sensing layer 12 will be changed is, and these changes will be received and treated by the processing circuit layer 17. The processing circuit layer 17 sends the treated information to a user control system and the feedback assembly 11 via the connecting wire 18 or other connecting manners to perform illumination independently.

The embodiment of the application further provides an electronic device, which comprises the above-mentioned touch control button 2. Compared to the prior art, in the electronic device of the embodiment of the application, the luminous pressure sensor 1 is adhered to a rear side of the touch control panel 20 having the light hole, such that the touch control button 2 having the pressure button, the pressure detection characteristics, and the luminous feedback can be obtained. A user can obtain a reliable and steady pressure sensing function and the luminous feedback assembly 11 without using complex structure processing and assembling processes. The electronic device produced by this manner has a high controlling sensitivity, lower production cost, and a beautiful overall appearance, thereby facilitating the promotion of the touch control button 2. In this way, users' enthusiasm of using the pressure sensing technique can be improved, the difficulty of application of the pressure sensor for user can be lowered, and users' or customers' experience during the pressing operations can be enriched.

Although what described in detail above provides at least one exemplary embodiment, it should be understood that there are lots of modifications. It should be further understood that the exemplary embodiments or plural of embodiments described herein are not intended to limit the scope, applicability and configuration of the claimed subject matter. In contrast, what described in detail above will provide a convenient map for the ordinary skilled in the art to realize said embodiments or plural of embodiments. It should be understood that various changes can be made in the arrangement of functions and elements without departing from the scope defined by the claims, known equivalents and predictable equivalents when the application is filed are included in the scope thereof.

The invention claimed is:

1. A touch control button, comprising an elastically deformable touch control panel, and further comprising the luminous pressure sensor comprising:
   a feedback assembly capable of emitting light when pressure is applied thereto,
   a pressure sensing layer for detecting pressure, and
   a sensing plate provided between the feedback assembly and the pressure sensing layer, the sensing plate being connected to the feedback assembly via a first connecting adhesive layer, the sensing plate being connected to the pressure sensing layer via a second connecting adhesive layer, the sensing plate being provided with at least one pressing structure thereon for concentrating pressing force,
   the touch control panel being connected with the feedback assembly via a third connecting adhesive layer, and a light hole configured for allowing light to pass through being provided at a central location of the touch control panel located on the pressing structure.

2. The touch control button according to claim 1, wherein the third connecting adhesive layer is made of transparent VHB acrylic plastic foam, transparent double-sided adhesive, transparent AB glue, transparent silica gel, or OCA optical adhesive, and the thickness of the third connecting adhesive layer ranges from 0.1 mm to 1.0 mm.

3. The touch control button according to claim 2, wherein the third connecting adhesive layer is made of transparent VHB acrylic plastic foam, and the thickness thereof is 0.2 mm.

4. An electronic device, comprising the touch control button according to claim 1.

5. The touch control button of claim 1, wherein the pressing structure comprises a pressure concentrating point and at least two extending cutout areas extending outwards from the pressure concentrating point.

6. The touch control button of claim 5, wherein the pressure concentrating point is disposed within a cutout area.

7. The touch control button according to claim 1, wherein the second connecting adhesive layer comprises AB glue, VHB acrylic plastic foam, double-sided adhesive and/or silica gel, and the thickness of the second connecting adhesive layer ranges from 0.02 mm to 0.2 mm.

8. The touch control button according to claim 7, wherein the second connecting adhesive layer comprises AB glue, and the thickness thereof is about 0.025 mm.

9. The touch control button according to claim 1, wherein the first connecting adhesive layer comprises VHB acrylic plastic foam, AB glue, double-sided adhesive and/or silica gel, and the thickness of the first connecting adhesive layer ranges from 0.1 mm to 1.0 mm.

10. The touch control button according to claim 9, wherein the first connecting adhesive layer comprises VHB acrylic plastic foam, and the thickness thereof is about 0.4 mm.

11. The touch control button according to claim 1, wherein the feedback assembly comprises a plurality of luminous bodies, each of the luminous bodies comprising an EL panel.

12. The touch control button according to claim 11, wherein a light insulator configured for avoiding optical crosstalk is provided between adjacent ones of the plurality of luminous bodies.

13. The touch control button according to claim 1, wherein the feedback assembly comprises a plurality of luminous bodies and light-guiding elements, and the luminous bodies are located at two sides of the light-guiding elements or at a lower end of the light-guiding elements.

14. The touch control button according to claim 13, wherein a light insulator configured for avoiding optical crosstalk is provided between adjacent ones of the plurality of light-guiding elements.

15. The touch control button according to claim 13, wherein at least one of the luminous bodies comprises a LED light.

16. The touch control button according to claim 1, wherein a further extending cutout area extending sideways thereof is provided at a distal end of each of the at least two extending cutout areas.

17. The touch control button according to claim 16, wherein the further extending cutout area comprises at least two second extending cutout areas arranged symmetrically or asymmetrically.

18. The touch control button according to claim 16, wherein the further extending cutout area is shaped as a strip structure.

19. The touch control button according to claim 16, wherein the further extending cutout area is shaped as an arc structure.

20. The touch control button according to claim 1, wherein the at least two extending cutout areas are arranged symmetrically or asymmetrically.

21. The touch control button according to claim 1, wherein one of the extending cutout areas is shaped as a strip structure.

22. The touch control button according to claim 1, wherein the pressure sensing layer is a coating or circuit with a pressure sensing function, the center thereof being provided with at least one sensor for pressure sensing, the sensing plate overlapping with the pressure sensing layer, and the sensor being located at a central location of the pressing structure where stress is concentrated.

23. The touch control button according to claim 1, further comprising a processing circuit layer configured for receiving and processing pressure signals, the processing circuit layer being electrically connected with the feedback assembly and the pressure sensing layer by a connecting wire.

* * * * *